United States Patent
Celik et al.

(10) Patent No.: US 7,890,915 B2
(45) Date of Patent: Feb. 15, 2011

(54) STATISTICAL DELAY AND NOISE CALCULATION CONSIDERING CELL AND INTERCONNECT VARIATIONS

(76) Inventors: Mustafa Celik, 1153 Loyola, Santa Clara, CA (US) 95051; Jiayong Le, 1047 Rich Ave., #6, Mountain View, CA (US) 94040

( * ) Notice: Subject to any disclaimer, the term of this patent is extended or adjusted under 35 U.S.C. 154(b) by 233 days.

(21) Appl. No.: 11/918,760

(22) PCT Filed: Mar. 17, 2006

(86) PCT No.: PCT/US2006/009634
§ 371 (c)(1),
(2), (4) Date: Oct. 18, 2007

(87) PCT Pub. No.: WO2006/102027
PCT Pub. Date: Sep. 28, 2006

(65) Prior Publication Data
US 2009/0288050 A1    Nov. 19, 2009

Related U.S. Application Data

(60) Provisional application No. 60/663,219, filed on Mar. 18, 2005.

(51) Int. Cl.
*G06F 9/455* (2006.01)
*G06F 17/50* (2006.01)

(52) U.S. Cl. .................. 716/113; 716/100; 716/103; 716/111; 716/115; 703/2; 703/13; 703/14

(58) Field of Classification Search ............... 716/1–3, 716/5–6, 18; 703/2, 13–14
See application file for complete search history.

(56) References Cited

U.S. PATENT DOCUMENTS

| | | | | |
|---|---|---|---|---|
| 6,314,546 B1 * | 11/2001 | Muddu | | 716/5 |
| 6,405,348 B1 * | 6/2002 | Fallah-Tehrani et al. | | 716/4 |
| 6,496,960 B1 * | 12/2002 | Kashyap et al. | | 716/4 |
| 6,904,572 B2 * | 6/2005 | Igarashi | | 716/2 |
| 2004/0167756 A1 * | 8/2004 | Yonezawa | | 703/2 |

* cited by examiner

*Primary Examiner*—Nghia M Doan
(74) *Attorney, Agent, or Firm*—Deborah Neville

(57) ABSTRACT

The electrical circuit timing method provides accurate nominal delay together with the delay sensitivities with respect to different circuit elements {e.g., cells, interconnects, etc.) and variational parameters (e.g., process variations; environmental variations). All the sensitivity computations are based on closed-form formulas; as a consequence, the method provides rapidly and at low cost high accuracy and high numerical stability.

3 Claims, 7 Drawing Sheets

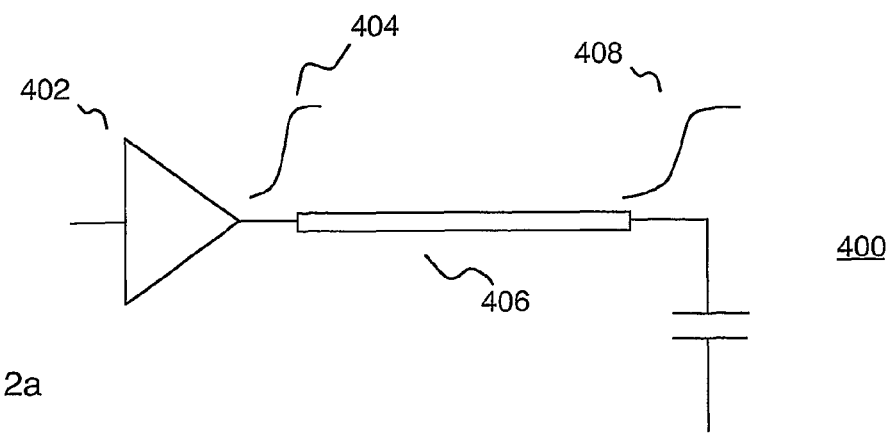
Fig. 2a
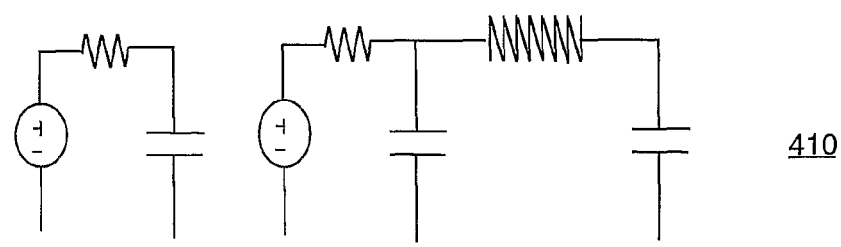
Fig. 2b
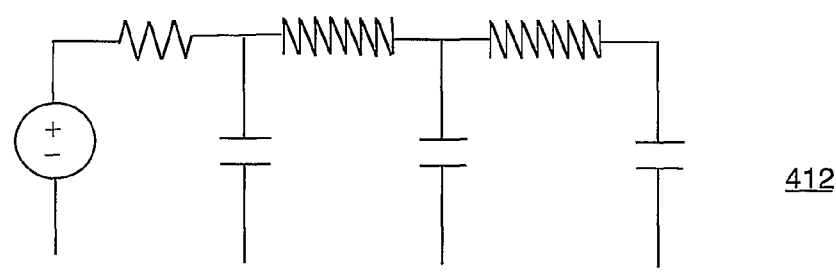
Fig. 2c
Fig 2

```
////////////////////////////////////////////////////////////////////////////////////
For each logic cell in the design {
   Load statistical cell information from library
   Load statistical interconnection information from extractor
   For each arc in the logic cell {
      Calculate statistical compact interconnect loading circuit {
         Collect statistical interconnection information {
            // R and C are functions of interconnect variations
            R = f(wire_width, thickness, ild, via_resistance, ...)
            C = g(wire_width, thickness, ild, via_resistance, ...)
         }
      }
      Construct equilibrium equation through effect capacitance iteration.
      Calculate statistical driving circuit model for the cell {
         // Each element of statistical driving (Thevenin / Norton) circuit
         // is expressed as functions input transition variation, cell variations
         // and interconnect elements and loading capacitance of the fanout
         // cells
         Driving_Circuit = f ( input_transition, input_tail,
                               cell_variation,
                               interconnect_element,
                               dynamic_capacitance_of_loading_cells )
      }                                                                    3a For each Fanout Pin of the Net {
         Calculate statistical transition function to fanout pin
         Calculate statistical waveform to fanout pin
         Calculate statistical delay and transition from waveform {
            // Using the delay definitions to build equilibrium equation
            v = v(t(w), w)
            dt/dw = dt/dv * dv/dw
         }
      }
     }
   }
 }                                                                          3b
////////////////////////////////////////////////////////////////////////////////////
```

Fig. 3

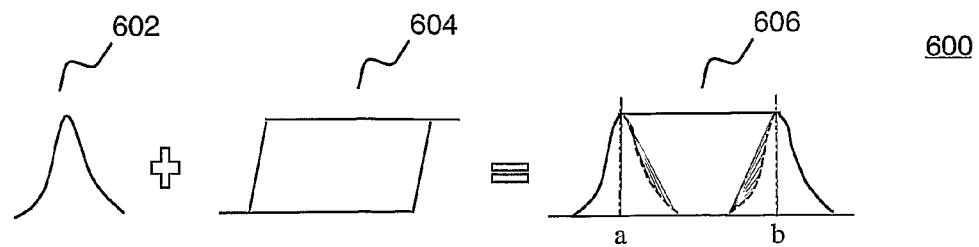
Fig. 5a
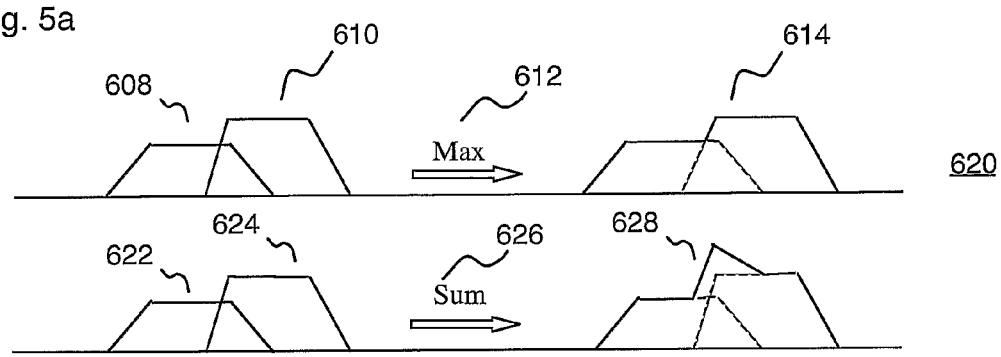
Fig. 5b
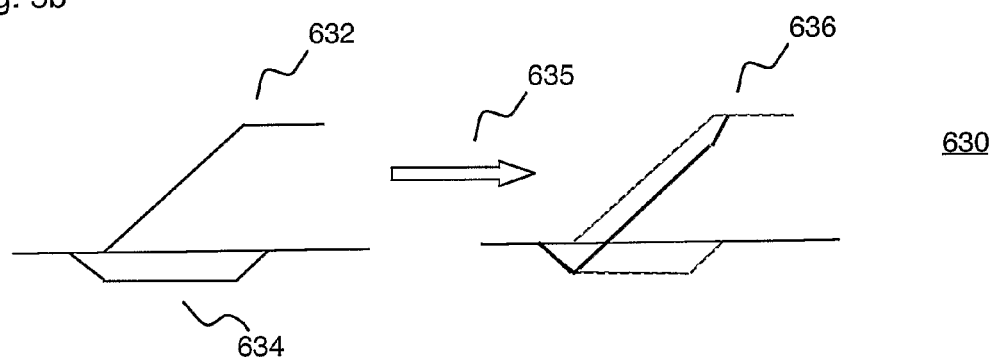
Fig. 5c
Fig. 5

For each cell in the design
    For each aggressor of the cell {
        For each aggressor cell input {
            Calculate the statistical noise waveform from a given aggressor cell input
            Calculate the statistical noise envelope from a given aggressor cell input
        }
        // To keep the pessimism, we take the worst case scenario of all possible input
        // from a given aggressors. Here we apply statistical max operation on the
        // waveforms.
        //

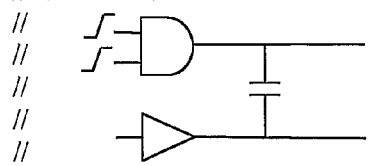

Calculate statistical MAX of the envelopes from all inputs of a given aggressor cell
    }

Fig. 6a

// To calculate total effects of statistical noise on victim, we need to add up all
// the noise effect from different aggressor nets.
//

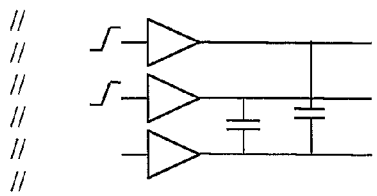

Calculate statistical SUM of all envelopes from different aggressors

// Now we have statistical noise envelopes, we can use that information to calculate
// statistical crosstalk delay using equilibrium equations that combine transition and
// noise waveform.
Calculate statistical output waveform with noise effect.
Calculate statistical crosstalk delay.

$$td_i = -\frac{v_i(td) + n_i(td)}{\partial v(td)/\partial td + \partial v(td)/\partial td}$$

// Note that to consider non-linear victim driver effect, we can updated each noise
// waveform based on updated output waveform and repeat above procedures.
}

STATISTICAL DELAY AND NOISE CALCULATION CONSIDERING CELL AND INTERCONNECT VARIATIONS

RELATED APPLICATIONS

This application claims priority from U.S. provisional application 60/663,219, filed Mar. 18, 2005, and the contents of which are incorporated in their entirety as if fully set forth herein.

GOVERNMENT FUNDING

Not applicable.

BACKGROUND

1. Field of the Invention

The invention generally relates to the field of integrated circuit design performance analysis and optimization, and particularly to the delay and crosstalk noise calculation for logic cells used in statistical static timing analysis of digital integrated circuit.

2. Description of the Related Art

In modern very large-scale integrated circuit (VLSI) design, it is very important to improve the circuit operating speed and to verify if the circuit can perform at a target frequency. To achieve these goals, circuit designers extensively use timing verification and optimization software from Electronic Design Automation (EDA) vendors on their designs. Two main methodologies for timing verification are used: 1) transistor-level simulation based method and 2) cell/gate-level static timing analysis. The transistor-level simulation method can accurately simulate the circuit timing behavior, but this method is very time-consuming and is not feasible for a full-chip analysis. Static timing analysis provides a fast method to estimate circuit timing performance, and can be used for full-chip analysis.

In VLSI digital circuits, logic cells are the basic building blocks; logic cells are interconnected with metal wires. In static timing analysis, logic cell delay models are becoming more and more complicated as semiconductor technologies evolve. Prior to the 1980s, cell delays could be modeled as a constant number. During the 1980s, CMOS technologies were widely used, and cell delays became a function of input transition time and load capacitance. Early in the 1990's, due to interconnect scaling, logic cell delays became a function of gate and RC (resistance capacitance) interconnect loading. In the early 2000s, the increased thickness of metal wire (relative to the feature size) has resulted in strong coupling capacitance between different interconnects; and logic cell delay has become a function of coupling interconnect (i.e., crosstalk).

Moreover, the further decrease in feature sizes for nanoscale CMOS technologies increases the importance of process variations. These variations introduce uncertainty in circuit behaviors and significantly impact the circuit performance and product yield. The increased variability has given a new set of problems for circuit timing analysis. However, current delay calculation methods do not handle process and environmental variations from both cells and interconnects. The corner-based methodology for worst-case analysis traditionally used in static timing analysis may be overly pessimistic as well as extremely inaccurate. A better circuit timing methodology is needed to more accurately account for circuit behavior as it is influenced by process variations.

Attempts to solve the statistical timing analysis problem can be largely be categorized as being in one of two approaches: either a path-based approach or a block-based approach. (See J. A. G. Jess and K. Kalafala et al, "Statistical timing for parametric yield prediction of digital integrated circuits", Design Automation Conference (DAC), pp. 932-937, June 2003; H. Chang and S. S. Sapatnekar, "Statistical Timing Analysis Considering Spatial Correlations using a Single Pert-like Transversal", ICCAD 2003, pp. 621-625, November 2003; Aseem Agarwal, David Blaauw, Vladimir Zolotov and Sarma B. K. Vrudhula, "Statistical Timing Analysis Using Bounds", DATE 2003, pp. 10062-10067; Anirudh Devgan and Chandramouli Kashyap, "Block-based Static Timing Analysis with Uncertainty", ICCAD 2003, November 2003; Jiayong Le, Xin Li and L. Pileggi, "STAC: statistical timing analysis with correlation," IEEE Design Automation Conference, 2004).

However, both path based and block based approaches focus not on delay calculation but on high level timing propagation problems wherein the delay is assumed (based on a simple model) rather than calculated. With the decreasing of feature size in semiconductor technology, statistical cell delay can no longer be modeled as a simple value or function. The non-linear input waveform, the metal interconnect resistiveness, and non-linear receiver capacitance all have strong effects on cell delay. While some of these factors are accounted for in nominal delay calculation techniques, other factors have yet to be modeled. Process variations cause these factors to have statistical distributions. Consequently, all nominal delay calculation approaches (such as, for example, the effective capacitance method) are not currently able to capture statistical information accurately. A statistical delay calculation methodology is needed for greater accuracy in statistical timing analysis.

Crosstalk between nanoscale size features also complicates statistical timing analysis. At nanoscale feature sizes, the dominant portion of wiring capacitance is the inter-layer neighboring wire capacitance. Consequently, the delay of a gate can be greatly impacted by the switching activity on neighboring wires (see R. Arunachalam, K. Rajagopal and L. Pileggi, TACO: Timing Analysis with Coupling" Proceedings of the Design Automation Conference, pp. 266-269, June 2000). Accounting for this cross-talk effect, therefore, is a critical part of the statistical timing analysis process.

The "crosstalk effect" becomes significant when the coupling capacitance between adjacent interconnects increases. A coupled interconnect system includes a victim net and several aggressor nets. For a good discussion of coupled interconnect systems, see R. Arunachalam, K. Rajagopal and L. Pileggi, TACO: Timing Analysis with Coupling" Proceedings of the Design Automation Conference, pp. 266-269, June 2000—which is incorporated by reference as if fully set forth herein. A net is a set of nodes resistively connected. A net has one driver node, one or more fanout nodes, and may have a number of intermediate nodes that are part of the interconnect. "Fanout" is the ability of a logic gate to drive further logic gates; fanout refers to or is quantified by referring to the number of gates before voltage falloff causes errors.

An "aggressor net" is a net that has significant coupling capacitance to the victim net so as to be able to influence the delay of the victim gate. A gate is a logic unit or cell. Each net has its ground capacitances, and there are coupling capacitances between different nets. When circuit feature size decreases, the space between interconnects is reduced and the ratio of coupling capacitance and substrate capacitance increases proportionally.

The effects of crosstalk ("crosstalk effect") pose two major problems. In the case where the victim net is quiet (non-switching), capacitive crosstalk can induce noise (glitches) and potentially cause functional failures. For example, if a glitch happens when the clock signal of a register is switching, the data in the register may be flipped accidentally. Alternatively, in a case where the victim net is active, crosstalk can change the delay of the victim if the aggressor is also switching. If the aggressor is switching in the opposite direction, crosstalk can lead to an increase in delay, which may cause "setup time violations." If the aggressor is switching in the same direction as the victim, crosstalk may lead to the delay decreasing, and may cause "hold time violations."

What is needed is a method of statistical timing that accounts for crosstalk as well as accounting for cell delay and noise.

SUMMARY OF INVENTION

The invention provides a sensitivity-based statistical delay calculation methodology. The inventive method provides accurate nominal delay together with the delay sensitivities with respect to different circuit elements (e.g., cells, interconnects, etc.) and variational parameters such as fabrication process and environmental variations. The invention provides a statistical delay calculation methodology, which can efficiently calculate nominal delay and its sensitivity over different parameters. In the inventive statistical effective capacitance approach, all the sensitivity computations are based on closed-form formulas; consequently, the inventive method provides, rapidly and at low cost, high accuracy and high numerical stability.

The invention also provides a method for calculating waveform-based statistical noise and cross-talk delay. By means of "built-in" noise waveform alignment techniques, the method can accurately calculate statistical noise waveform and its impact on delay. The invention taught herein applies statistical Max and Sum operations to statistical noise waveform and noise envelope calculations.

The invention taught herein is broadly represented in FIG. 1. The invention provides statistical delay calculation 302 considering non-linear cell input noise waveform and receiver capacitance. The invention further provides statistical noise calculation 304 considering non-linear victim driver resistance model and multiple timing windows. The invention further provides statistical crosstalk delay calculation 306 combining non-cross-talk statistical delay and statistical noise information—using pure analytical approaches and guaranteeing pessimism.

The inventive method of calculating delay comprises a first step of calculating a statistical driving circuit, and includes the sub-steps of calculating statistical compact interconnect load; calculating nominal effective capacitance through an equilibrium equation; and calculating statistical driving Thevenin/Norton circuit.

Once the Thevenin circuit is parameterized, the invention farther provides for determining statistical delay and transition by: calculating the statistical transfer function to fanout pins; calculating the statistical voltage waveforms at the fanout pins; and calculating the statistical delay and the transition from the waveforms.

The inventive method further provides the step of statistical noise calculation including the sub-steps of: a) calculating statistical noise waveform and envelope for a given input pin of a given aggressor cell; b) repeating Step a for all input pins of a given aggressor cell; c) calculating the statistical Max of the noise envelopes from all input pins of a given aggressor cell; d) repeating Step c for all aggressor cells; e) calculating the statistical Sum of the noise envelopes from all aggressors cells.

Also taught is a method of crosstalk delay calculation that includes the steps of: calculating statistical output waveform as the statistical Sum of the statistical fanout waveform of the victim cell (the value of the statistical fanout waveform from the victim cell is provided by the delay calculation of the method taught herein) and statistical noise waveform from the aggressor cells (the value of the statistical noise waveform from the aggressor cells is provided by the noise calculation of the method taught herein) and calculating crosstalk delay from statistical waveform using an equation $$td_i = -\frac{v_i(td) + n_i(td)}{\partial v(td)/\partial td + \partial v(td/\partial td)}$$

where td=time delay, v=voltage and n=noise.

As can easily be appreciated, the system and method may be implemented via software—computer readable media—or any configuration of components capable of delivering instructions to a central processing unit of any computing device. Moreover, an apparatus for performing the invention as well as a product resulting from the invention are within the scope of the teaching and claims.

BRIEF DESCRIPTION OF THE DRAWINGS

The present invention will be understood and appreciated more fully from the following detailed description taken in conjunction with the drawings in which:

FIG. 2a-c illustrates the main steps in the method of statistical delay calculation, which includes statistical driving circuit constructing and statistical fanout waveform and delay/transition calculation.

FIG. 3a-b is pseudo code representing the method of statistical delay calculation.

FIG. 5a-c inclusive illustrates the main steps of the method for statistical noise and statistical crosstalk delay calculation, including noise/envelope statistical operation and worst case crosstalk delay calculations.

FIG. 6a-b, inclusive, is pseudo code representing the method for determining statistical noise and crosstalk delay.

DETAILED DESCRIPTION OF THE PREFERRED EMBODIMENTS

Figure 1:
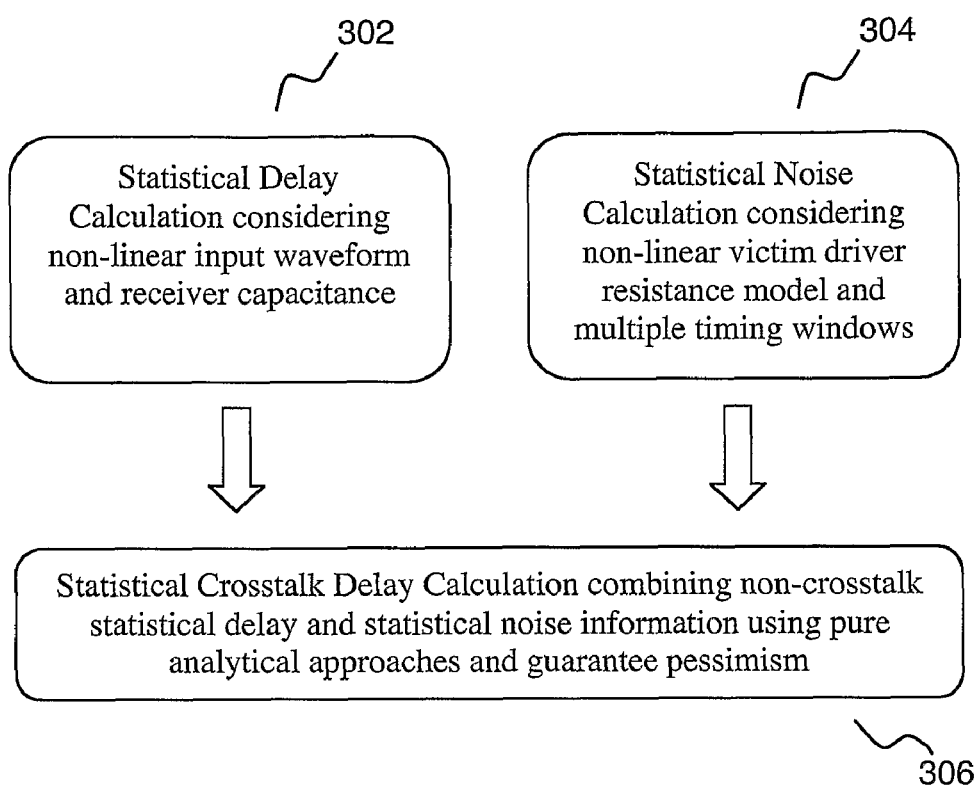
FIG. 1 is a summary chart of the invention taught herein, and some components (statistical delay calculation, statistical noise calculation, statistical crosstalk delay evaluation) and relationships of those components in the preferred embodiment.

The invention taught herein is broadly represented in FIG. 1. The invention provides a method of determining statistical delay 302 considering non-linear input waveform and receiver capacitance. The invention further provides a method for statistical noise calculation 304 considering non-linear victim driver resistance model and multiple timing windows. The invention further provides statistical crosstalk delay calculation 306 combining non-cross-talk statistical delay and statistical noise information using pure analytical approaches and guarantee pessimism (i.e., satisfying a verification condition ensuring the IC chip circuits function).

In modern VLSI digital circuit, logical cell delay is a function of different physical sources. Cell delay is a function of non-linear input waveform, non-linear receiver load capacitances, resistive interconnect load, crosstalk effect and process and environmental variations.

With the increasing effects of interconnect resistance, gate output waveforms becomes increasingly non-digital and can no longer be modeled as saturated ramps. To solve this problem, delay calculations with the Ceff (Coupled gate effective capacitance) concept is widely used to take into the RC shielding effect of an interconnect (see J. Qian, S. Pullela, and L. T. Pileggi, "Modeling the effective capacitance for the RC Interconnect of CMOS gates," IEEE Trans. On Computer-Aided Design, vol. 13 no. 12, pp. 1526-1534, December, 1994).

Figure 4:
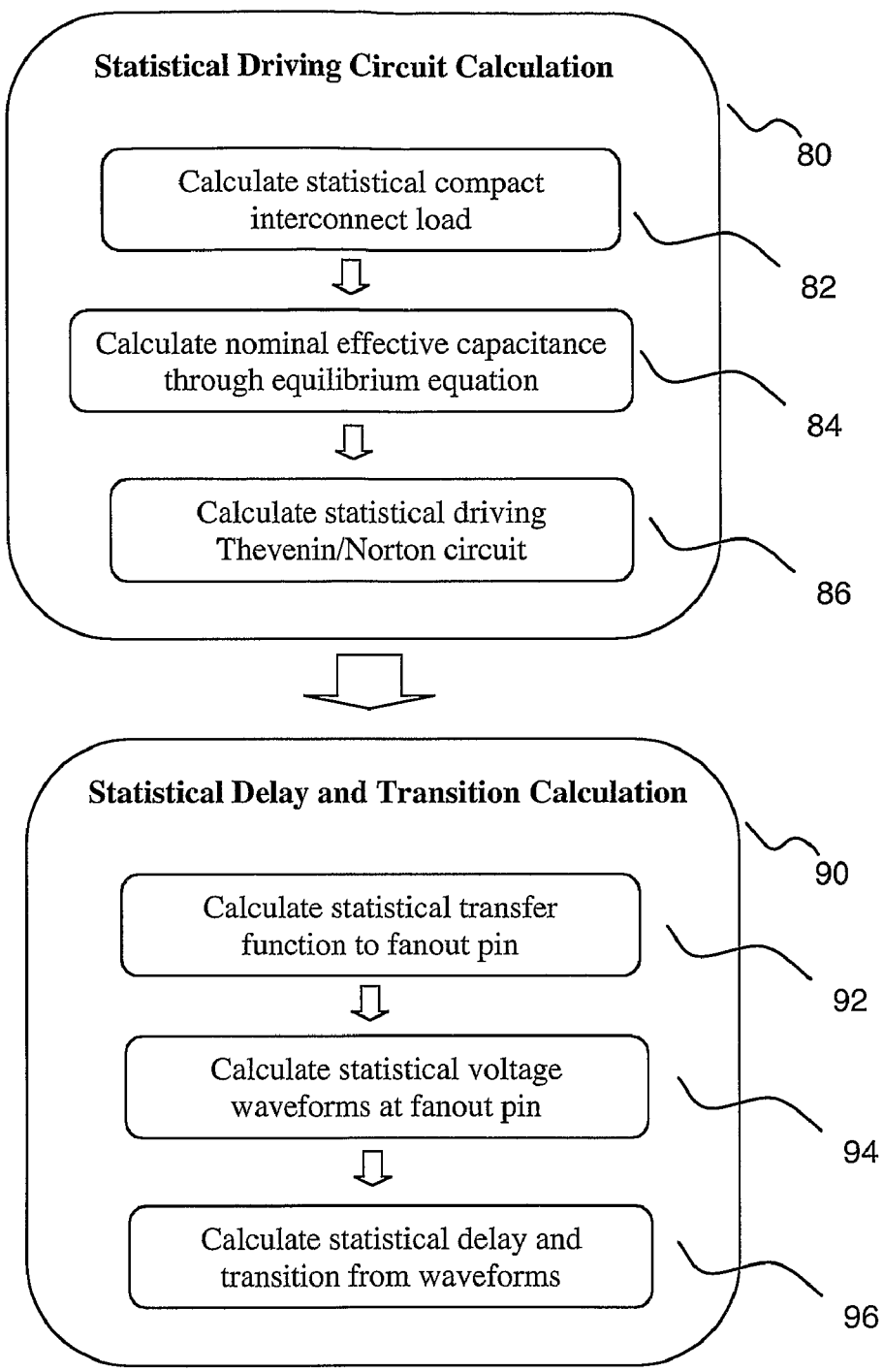
FIG. 4 is a flow chart depicting the steps of FIG. 2a-c and FIG. 3a-b according to the preferred embodiment.

FIG. 2 sketches the concepts underlying the steps to determine statistical delay. FIG. 3 provides pseudocode for the inventive approach diagrammed in FIG. 2; FIG. 4 depicts the steps of the approach as in FIG. 2 and FIG. 3 in a flow chart. Initially, a statistical π circuit load model is constructed from the statistical interconnect information. The statistical π circuit load model is used to calculate the statistical Thevenin model through using the inventive equilibrium point equations; the equations include the sensitivities over input slope, cell process parameters and π load. FIG. 2a (400): represents a total circuit; logic circuit 402; a first waveform 404; an interconnect (RC) 406; a second waveform 408. FIG. 2b (410) (and see FIG. 3a). The steps are shown in FIG. 4: statistical driving circuit calculation 80 including the substeps of calculating the statistical compact interconnect load 82; calculating the nominal effective capacitance through an equilibrium equation 84; and calculating the statistical driving Thevenin/Norton circuit 86.

Once the Thevenin model is parameterized, the interconnect 406 is then attached to the linear gate model (see FIG. 2b) and a statistical linear circuit evaluation is performed to calculate the statistical fanout delay and slope (see FIG. 2c (412)) (and see FIG. 3b). The steps are shown in FIG. 4, statistical delay and transition calculation 90 and include the substeps of: calculating statistical transfer function to fanout pins 92; calculating statistical voltage waveforms at fanout pins 94; and calculating statistical delay and transition from waveforms 96.

Equivalent Statistical Driver Model Calculation

The preferred embodiment of the invention as regards delay calculation includes the steps as set forth herein. Initially, a statistical Thevenin model is constructed from statistical Effective Capacitance evaluation. Then a nominal Ceff evaluation is performed to construct an equivalent Thevenin model. (A detailed nominal Ceff evaluation process can be found in Mustafa Celik, Lawrence Pileggi and Altan Odabasioglu, "IC Interconnect Analysis", Kluwer Academic Publishers, 2002 (incorporated by reference as if fully set forth herein)).

At this point, to aid the reader, the derivation is omitted and the resulting equation shown—the final average current expression for both π load and Ceff load from our modified nominal Ceff calculation. An equivalent Thevenin model can be computed by iteratively matching these two equations. As is shown in equations (1) and (2), to avoid unstable numerical computation, the inventive method improves the nominal Ceff evaluation by expressing the average current in turns of time constant.

$$i_\pi = \frac{\beta}{\Delta}\left(1 + \frac{k_{\tau 1} \cdot \tau_1}{\Delta}\left(e^{-\frac{\Delta}{\tau_1}} - 1\right) + \frac{k_{\tau 2} \cdot \tau_2}{\Delta}\left(e^{-\frac{\Delta}{\tau_2}} - 1\right)\right) \quad (1)$$

$$i_{c_{\it eff}} = \frac{c_{\it eff}}{\Delta}\left(1 + \frac{\tau}{\Delta}(e^{-\frac{\Delta}{\tau}} - 1)\right) \quad (2)$$

Once the nominal Thevenin model is available, one can start to compute its sensitivity with respect to different circuit element and process parameters. To simplify the computation, we rewrite the Ceff expression in a general form as shown in equation (3) where S(si,w,Ceff) and T(si,w,Ceff) are output slew and time constant that are directly queried from cell table during Ceff iteration. Among all the variables in equation (3), only input slew ($s_i$) and π load ($\pi=c_1, c_2, r_{pi}$) are original variables. Considering process variation, we also introduce a new variable—w—which represents variational cell process parameters.

$$\text{Ceff}(si,\pi,w) = F(\pi, \text{Ceff}, S(si,w,\text{Ceff}), T(si,w,\text{Ceff})) \quad (3)$$

Note that this equation (3) should always be satisfied. Thus its derivatives with respect to every original variable should be equal to zero. Using the satisfied equation, we can calculate the sensitivities of Ceff to input slew, π load and cell process variables: dCeff/dsi, dCeff/dw and dCeff/dπ.

Once statistical Ceff is available, the sensitivity of Thevenin model with respect to different variables can be easily computed by applying the chain rule.

Statistical Waveform Propagation and Statistical Delay and Transition Calculation Once the statistical Thevenin model is available, an interconnect can be attached, and fanout delay and transition can then be calculated through statistical fanout moment. As in the previous steps (see FIG. 3a), a nominal fanout delay evaluation is performed before sensitivity computations. Equation (4) shows the formula of fanout waveform with two-pole approximation:

$$v(t) = \begin{cases} \dfrac{k_1}{\Delta \cdot p_1^2}(e^{p_1 t} - 1 - p_1 t) + \dfrac{k_2}{\Delta \cdot p_2^2}(e^{p_2 t} - 1 - p_2 t) & (t \le \Delta) \\ \dfrac{k_1}{\Delta \cdot p_1^2}\left(\begin{array}{c} e^{p_1 t} - \\ e^{p_1(t-\Delta)} - p_1 \Delta\end{array}\right) + \dfrac{k_2}{\Delta \cdot p_2^2}\left(\begin{array}{c} e^{p_2 t} - \\ e^{p_2(t-\Delta)} - p_2 \Delta\end{array}\right) & (t > \Delta) \end{cases} \quad (4)$$

From equation (4), we can calculate the sensitivity of the output waveform with respect to poles and zeros; the chain rule is then used to calculate the sensitivity for the Thevenin circuit and the interconnect load. Once waveform sensitivity has been thus determined, using the condition that $v(t_d) \equiv v_d$ and $v_d$ is a fixed value, we can compute the timing sensitivity for a different fixed voltage point:

$$\frac{\partial t_d}{\partial x} = -\left(\frac{\partial v(t_d)}{\partial x}\right) \Big/ \left(\frac{\partial v(t_d)}{\partial t_d}\right) \quad (5)$$

Statistical Noise and Crosstalk Delay Calculation

Figure 7:
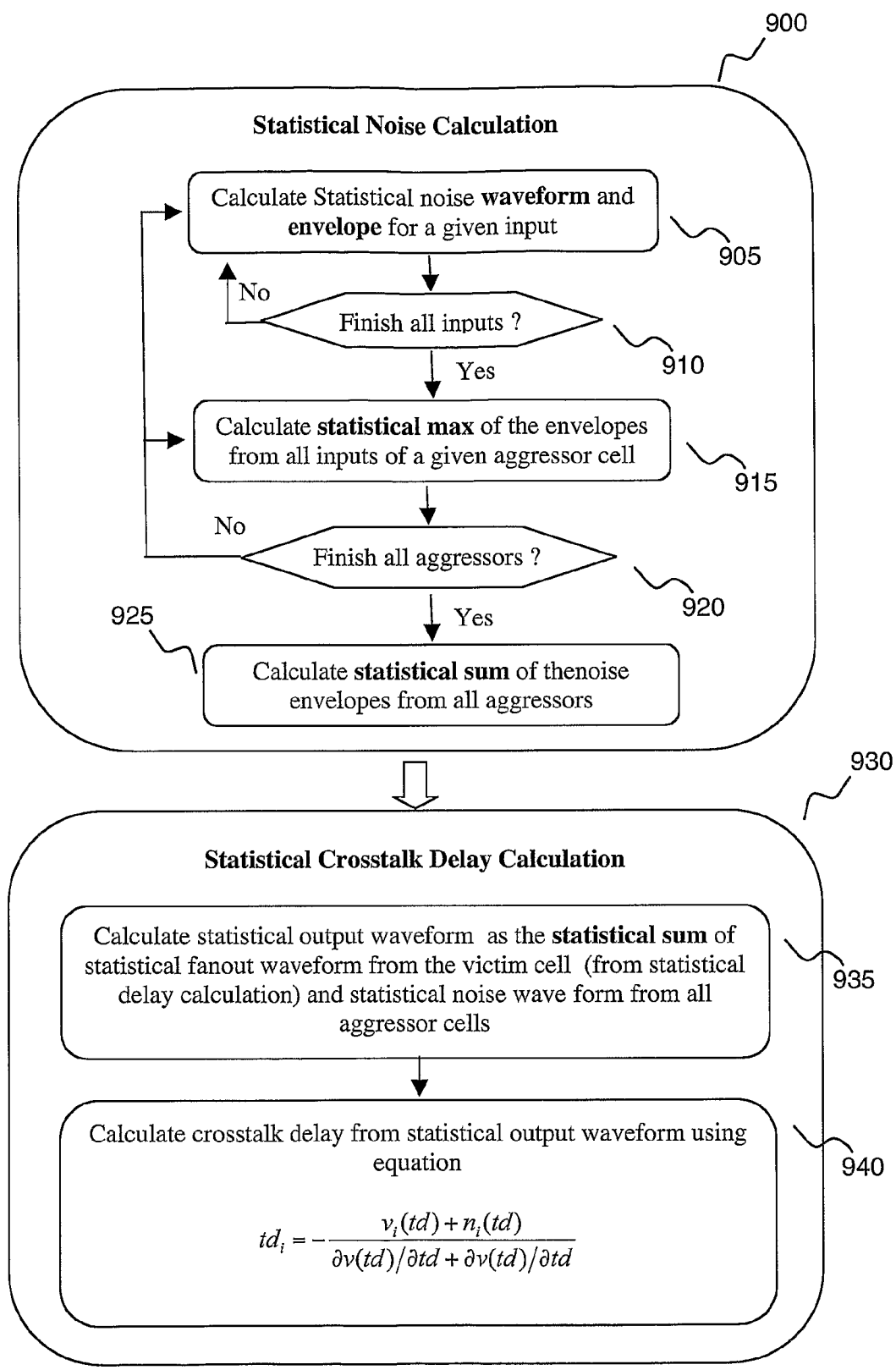
FIG. 7 is a flow chart depicting the steps of FIG. 5a-c and FIG. 6a-b according to the preferred embodiment.

The invention provides a novel method for statistical noise analysis and crosstalk delay calculation (see FIG. 1, 306). The method naturally combines aggressor timing window with noise waveform to reduce pessimism. It also takes into account the process variations from both aggressor and victim net driving cell. FIG. 6 presents pseudocode expressing the main steps for statistical noise and crosstalk delay calculations according to the preferred embodiment. FIG. 7 is a flow chart showing the steps for statistical noise calculation.

When the aggressor net is switching, its driving cell can be modeled as a Thevenin linear circuit. And the transfer function from aggressor driver pin to victim fanout pin can be calculated using moment-based methods. If we assume the transition time of the aggressor voltage source is $\Delta$, and the transfer function is modeled as a two-pole function where p1, p2, k1, k2 are corresponding poles and residues, the fanout noise waveform can be calculated using the following equations:

$$v(t) = \begin{cases} \frac{k_1}{\Delta \cdot p_1}(e^{p_1 t} - 1) + \frac{k_2}{\Delta \cdot p_2}(e^{p_2 t} - 1) & (t \leq \Delta) \\ \frac{k_1}{\Delta \cdot p_1}(e^{p_1 t} - e^{p_1(t-\Delta)}) + \frac{k_2}{\Delta \cdot p_2}(e^{p_2 t} - e^{p_2(t-\Delta)}) & (t > \Delta) \end{cases} \quad (6)$$

Noise waveform calculated in equation (6) has several useful features. First, noise waveform starts from zero (v(0)=0) and end up with zero (v(∞)=0). Second, there is one and only one peak on the waveform, and the voltage before-peak and after-peak decreases monotonically. Once the nominal waveform is calculated, it is straightforward to calculate the statistical waveform dv(t)/dw by applying the chain rule on equation (6).

Equation (6) gives the statistical noise waveform at victim net when aggressor net switches at time t=0. However, in static timing analysis, the exact switching time at a timing node is not known: only the earliest/latest arrival time is available. The aggressor cell/net input pin can switch at any time in this period between the earliest and the latest time available. In order to create the "worst case" noise scenario, we can combine the noise waveform with the arrival timing window to create a noise envelope.

A single noise envelope (see FIG. 5a, 606) from a noise waveform 602 and a timing window 604 represents the worst case noise peak from a single aggressor. In general, there are multiple aggressors in a coupled system. To calculate the total noise effect on a victim from all aggressors, we combine all the noise envelopes.

There are two basic operations for noise envelope combination: Max and Sum. As shown in FIG. 5b, the Max 612 operation takes the bigger value of the envelope over the total time interval, while the Sum 626 operation adds two envelopes 622, 624 together to create a new envelope 628. The Sum operation is used to combine noise envelopes that come from all the aggressor nets and drivers. The Max operation is used to combine noise envelopes that come from all the input pins of each aggressor driver. Statistical noise calculation according to the present invention appears as a flow chart in FIG. 7.

Referring to FIG. 7, the steps for statistical noise calculation 900 include the substeps of:
a) Calculating statistical noise waveform and envelope for a given input pin of a given aggressor cell 905;
b) Repeating Step a for all input pins of the aggressor cell 910;
c) Calculating the statistical Max of the envelopes from all input pins of a given aggressor cell 915;
d) Repeating Step c for all aggressors cells 920;
e) Calculating the statistical Sum of noise envelopes from all aggressor cells 925.

Under process and environmental variations, noise waveforms and noise envelopes become statistical. To calculate the statistical noise waveform, the same "Max" and "Sum" concepts can be used. However, with process variations, these Max and Sum operations have to work on random variables instead of deterministic values.

Assume normal random variables x and y can be expressed as linear function of a set of independent random variables $(p_1, p_2 \ldots p_n)$, e.g. $x = x_0 + x_1 \cdot p_1 + x_2 \cdot p_2 + \ldots x_n \cdot p_n$ and $y = y_0 + y_1 p_1 + y_2 \cdot p_2 + \ldots x_n \cdot p_n$. The Sum operation is straightforward, $s = (x+y) = (x_0 + y_0) + (x_1 + y_1)p_1 + \ldots + (x_n + y_1)p_n$. For Max operation z=Max (x, y), analytical formulas exist so that variable z can also be approximated by the same set of random variables $z = z_0 + z_1 \cdot p_1 + z_2 \cdot p_2 + \ldots z_n \cdot p_n$. The parameters $z_0$ and $z_i$ can be calculated from equation (7), where $\phi(\bullet)$ and $\Phi(\bullet)$ are the probability density function (PDF) and the cumulative distribution function (CDF) of normal random variables, a=sqrt $(\sigma_x^2 + \sigma_y^2 - 2\sigma_x \sigma_y \rho_{xy})$ and $\alpha = (\mu_x - \mu_y)/a$.

$$z_0 = \mu_z = x_0 \Phi(\alpha) + y_0 \Phi(-\alpha) + \alpha \varphi(\alpha) \quad (7)$$

$$z_i = \rho_{z,p_i} = x_i \Phi(\alpha) + y_i \Phi(-\alpha)$$

The invention teaches using the statistical Sum and Max operations so as to calculate a final statistical noise waveform from individual noise waveforms. The invention teaches applying statistical Max and Sum operations to statistical noise waveform and envelope calculations. Referring again to FIG. 7, the step of statistical crosstalk delay calculation 930 includes the sub-steps of:

Calculating the statistical output waveform as the statistical Sum of the statistical fanout waveform from victim cell (from the statistical delay calculation) and statistical noise waveform from all aggressor cells 935; and Calculating crosstalk delay from the statistical waveform using the equation 940

$$td_i = -\frac{v_i(td) + n_i(td)}{\partial v(td)/\partial td + \partial v(td)/\partial td} \quad (8)$$

Crosstalk delay is a function of both noise waveform and original fanout waveform. Once available, total statistical noise waveform and statistical fanout waveform can be combined to calculate statistical crosstalk delay as a linear function of different process variables.

---

Theorem 1: Given victim fanout voltage waveform $v(t) = v_0(t) + v_1(t) \cdot p_1 + v_2(t) \cdot p_2 + \ldots v_i(t) \cdot p_i \ldots$
and noise waveform at the same fanout $n(t) = n_0(t) + n_1(t) \cdot p_1 + n_2(t) \cdot p_2 + \ldots n_i(t) \cdot p_i \ldots$, where $(p_1, p_2 \ldots)$ are a set of independent normal random variables, the statistical crosstalk delay td at that fanout can be calculated as $td = td_0 + td_1 \cdot p_1 + td_2 \cdot p_2 + \ldots td_i \cdot p_i \ldots$ and $$td_i = -\frac{v_i(td) + n_i(td)}{\partial v(td)/\partial td + \partial v(td)/\partial td} \quad (9)$$

---

Theorem 1 can be proved by combining the statistical transition waveform and noise waveform and applying the chain rule. Because the transition waveform and the noise waveform both include statistical information, using Equation (9) we can easily calculate statistical crosstalk delay distributions.

As can easily be appreciated by those of skill in the relevant art, the system and method may be implemented via software—computer readable media—or in any configuration enabling the delivery of instructions for practicing the invention to any central processing unit of any suitable computing device. Moreover, an apparatus for performing the invention as well as a product resulting from the invention are within the scope of the teaching and claims.

The present invention is not limited to given embodiments or examples; the attached set of claims in light of the drawings and specification define possible further embodiments for a person skilled in the art.

The invention claimed is:

1. A method for determining delay in static timing analysis of an integrated circuit of interest, said integrated circuit comprised of a plurality of logic cells, where said delay as determined is expressed as a parametric function, said parametric function containing statistical manufacturing process variations introduced by the process of manufacturing said logic cells of said integrated circuit, said method comprising the steps of:

a) calculating, said calculating performed by means of a computational device said computational device including a CPU, a driving circuit for a first logic cell of said integrated circuit of interest, said driving circuit containing in parametric form manufacturing process variations of said integrated circuit, said calculating said driving circuit including the sub-steps of:

1. calculating a compact interconnect load for said first logic cell, said compact interconnect load containing in parametric form manufacturing process variations, wherein said calculating said compact interconnect load for said first logic cell further includes
matching the statistical moment of the non-compacted interconnect load of said first logic cell where said statistical moment contains parametric form of manufacturing process variations,
and wherein calculating said statistical moment includes the substeps of:
evuluating, said non-compacted interconnect load of said first logic cell and
calculating the corresponding moment sensitivity from the parametric sensitivity of said non-compacted interconnect load of said first logic cell by the substeps of:
calculating, by applying adjoint circuit techniques said moment sensitivities, and
calculating said moment sensitivities through multiple evaluations of different adjoint circuits under variant voltage and current sources;

2. calculating, using said compact interconnect load of sub-step 1, an effective capacitance with respect to said first logic cell, said effective capacitance representing a distribution of load, and where said calculation of said effective capacitance is derived by matching the current that goes through said statistical compact load in sub-step 1 with the current that goes through an effective capacitance, as described in the equations $$i_\pi = \frac{\beta}{\Delta}\left(1 + \frac{k_{\tau 1} \cdot \tau_1}{\Delta}\left(e^{-\frac{\Delta}{\tau_1}} - 1\right) + \frac{k_{\tau 2} \cdot \tau_2}{\Delta}\left(e^{-\frac{\Delta}{\tau_2}} - 1\right)\right) \quad (1)$$

$$i_{ceff} = \frac{c_{eff}}{\Delta}\left(1 + \frac{\tau}{\Delta}(e^{-\frac{\Delta}{\tau}} - 1)\right) \quad (2)$$

and further calculating the variation for said effective capacitance from application of an equilibrium equation, $$Ceff(si,\pi,w) = F(\pi, Ceff, S(si,w,Ceff), T(si,w,Ceff)) \quad (3)$$

where S(si,w,Ceff) is output slew, and T(si,w,Ceff) is time constant, si is input slew and w represents variational cell process parameters, said equilibrium equation containing in parametric form manufacturing process variations, said manufacturing process variations in said equilibrium equation (represented by the variable "w") from three variation sources: the transition time of the input waveform, the intrinsic cell variations and the variations of compact load from sub-step 1,
and wherein, using iterative methods, the nominal solution of said equilibrium equation is calculated and said nominal solution is defined as the operating point of said equilibrium equation where the derivative of said three variation sources is equal to zero,
such that taking the derivative of said equilibrium equation with respect to said three variation sources and
setting the resulting derivative equations to zero, calculates the parametric variation sensitivities of said effective capacitance;

3. calculating, using said compact interconnect load and said effective capacitance of sub-steps 1 and 2, an equivalent driving circuit of said first logic cell,
wherein said equivalent driving circuit contains a voltage source connected with a resistance, and where
said voltage source and said resistance are functions of said three variations sources discussed in sub-step 2, (i.e. input transition, intrinsic cell variations and compact load variations) and
further said voltage source and said resistance are also functions of the statistical effective capacitance calculated in sub-step 2,
and wherein variations with respect to said voltage source are calculated directly by taking the derivatives of said equivalent driving circuit with respect to said three variation sources discussed in sub-step 2,
and wherein by further calculating the effective capacitance introduced variations by calculating the derivatives of said equivalent driving circuit with respect to said effective capacitance and
by mapping said effective capacitance variation with respect to said three variation sources using chain rule, and
calculating, (after mapping said derivatives of the effective capacitance to the derivatives of said three variation sources), the parametric variation of said equivalent driving circuit by combining the derivatives and the variations of said three variation sources;

b) calculating, said calculating performed by means of said computational device, delay and transition for said driving circuit of step (a), including the substeps of:

4. calculating transfer function to fanout pins, said transfer function including in parametric form manufacturing process variations;

5. calculating, using said transfer function of substep 4, voltage waveforms at fanout pins, said voltage waveforms including in parametric form manufacturing process variations;
6. calculating, using said voltage waveforms at fanout pins from substep 5, delay and transition from said voltage waveforms; and c) repeating steps a) and b) for each logic cell comprising said integrated circuit of interest, and then outputting results, where said results map manufacturing process variations in logic cells comprising said integrated circuit of interest to performance variations of said integrated circuit of interest.

2. A non-transitory computer readable medium containing an executable program having instructions to direct a central processing unit to determine the delay in static timing analysis of a plurality of interconnected logic cells comprising an integrated circuit of interest, where said program comprises instructions to direct the computer to perform the steps of:

a) calculating, said calculating perfomed by means of a computational device said computational device including a CPU, a driving circuit for a first logic cell of said integrated circuit of interest, said driving circuit containing in parametric form manufacturing process variations of said integrated circuit, said calculating said driving circuit including the sub-steps of :

1. calculating a compact interconnect load for said first logic cell, said compact interconnect load containing in parametric form manufacturing process variations, wherein said calculating said compact interconnect load for said first logic cell further includes matching the statistical moment of the non-compacted interconnect load of said first logic cell where said statistical moment contains parametric form of manufacturing process variations, and wherein calculating said statistical moment includes the substeps of:

evaluating, said non-compacted interconnect load of said first logic cell and calculating the corresponding moment sensitivity from the parametric sensitivity of said non-compacted interconnect load of said first logic cell by the substeps of:

calculating, by applying adjoint circuit techniques said moment sensitivities, and calculating said moment sensitivities through multiple evaluations of different adjoint circuits under variant voltage and current sources;

2. calculating, using said compact interconnect load of sub-step 1, an effective capacitance with respect to said first logic cell, said effective capacitance representing a distribution of load, and where said calculation of said effective capacitance is derived by matching the current that goes through said statistical compact load in sub-step 1 with the current that goes through an effective capacitance, as described in the equations $$i_\pi = \frac{\beta}{\Delta}\left(1 + \frac{k_{\tau 1} \cdot \tau_1}{\Delta}\left(e^{-\frac{\Delta}{\tau_1}} - 1\right) + \frac{k_{\tau 2} \cdot \tau_2}{\Delta}\left(e^{-\frac{\Delta}{\tau_2}} - 1\right)\right) \quad (1)$$

$$i_{ceff} = \frac{c_{eff}}{\Delta}\left(1 + \frac{\tau}{\Delta}\left(e^{-\frac{\Delta}{\tau}} - 1\right)\right) \quad (2)$$

and further calculating the variation for said effective capacitance from application of an equilibrium equation, $$Ceff(si,\pi,w) = F(\pi, Ceff, S(si,w,Ceff), T(si,w,Ceff)) \quad (3)$$

where $S(si,w,Ceff)$ is output slew, and $T(si,w,Ceff)$ is time constant, si is input slew and w represents variational cell process parameters, said equilibrium equation containing in parametric form manufacturing process variations, said manufacturing process variations in said equilibrium equation (represented by the variable "w") from three variation sources: the transition time of the input waveform, the intrinsic cell variations and the variations of compact load from sub-step 1, and wherein, using iterative methods, the nominal solution of said equilibrium equation is calculated and said nominal solution is defined as the operating point of said equilibrium equation where the derivative of said three variation sources is equal to zero, such that taking the derivative of said equilibrium equation with respect to said three variation sources and setting the resulting derivative equations to zero, calculates the parametric variation sensitivities of said effective capacitance;

3. calculating, using said compact interconnect load and said effective capacitance of sub-steps 1 and 2, an equivalent driving circuit of said first logic cell, wherein said equivalent driving circuit contains a voltage source connected with a resistance, and where said voltage source and said resistance are functions of said three variations sources discussed in substep 2, (i.e. input transition, intrinsic cell variations and compact load variations) and further said voltage source and said resistance are also functions of the statistical effective capacitance calculated in sub-step 2, and wherein variations with respect to said voltage source are calculated directly by taking the derivatives of said equivalent driving circuit with respect to said three variation sources discussed in sub-step 2, and wherein by further calculating the effective capacitance introduced variations by calculating the derivatives of said equivalent driving circuit with respect to said effective capacitance and by mapping said effective capacitance variation with respect to said three variation sources using chain rule, and calculating, (after mapping said derivatives of the effective capacitance to the derivatives of said three variation sources), the parametric variation of said equivalent driving circuit by combining the derivatives and the variations of said three variation sources;

b) calculating, said calculating performed by means of said computational device, delay and transition for said driving circuit of step (a), including the substeps of:

4. calculating transfer functior to fanout pins, said transfer function including in parametric form manufacturing process variations;

5. calculating, using said transfer function of substep 4, voltage waveforms at fanout pins, said voltage waveforms including in parametric form manufacturing process variations;
6. calculating, using said voltage waveforms at fanout pins from substep 5, delay and transition from said voltage waveforms; and c) repeating steps a) and b) for each logic cell comprising said integrated circuit of interest, and then outputting result, where said results map manufacturing process variations in logic cells comprising said integrated circuit of interest to performance variations of said integrated circuit of interest.

3. A computer output product produced by the process of analyzing timing of an integrated circuit of interest, said integrated circuit comprised of a plurality of logic cells, the process comprising the steps of:

a) calculating, said calculating performed by means of a computational device said computational device including a CPU, a driving circuit for a first logic cell of said integrated circuit of interest, said driving circuit containing in parametric form manufacturing process variations of said integrated circuit, said calculating said driving circuit including the sub-steps of:

1. calculating a compact interconnect load for said first logic cell, said compact interconnect load containing in parametric form manufacturing process variations, wherein said calculating said compact interconnect load, for said first logic cell further includes
   matching the statistical moment of the non-compacted interconnect load of said first logic cell where said statistical moment contains parametric form of manufacturing process variations,
   and wherein calculating said statistical moment includes the substeps of:
      evaluating, said non-compacted interconnect load of said first logic cell and
      calculating the corresponding moment sensitivity from the parametric sensitivity of said non-compacted interconnect load of said first logic cell by the substeps of:
         calculating, by applying adjoint circuit techniques said moment sensitivities, and
         calculating said moment sensitivities through multiple evaluations of different adjoint circuits under variant voltage and current sources;

2. calculating, using said compact interconnect load of sub-step 1, an effective capacitance with respect to said first logic cell, said effective capacitance representing a distribution of load, and where said calculation of said effective capacitance is derived by matching the current that goes through said statistical compact load in sub-step 1 with the current that goes through an effective capacitance, as described in the equations $$i_\pi = \frac{\beta}{\Delta}\left(1 + \frac{k_{\tau 1} \cdot \tau_1}{\Delta}\left(e^{-\frac{\Delta}{\tau_1}} - 1\right) + \frac{k_{\tau 2} \cdot \tau_2}{\Delta}\left(e^{-\frac{\Delta}{\tau_2}} - 1\right)\right) \quad (1)$$

$$i_{ceff} = \frac{c_{eff}}{\Delta}\left(1 + \frac{\tau}{\Delta}(e^{-\frac{\Delta}{\tau}} - 1)\right) \quad (2)$$

and further calculating the variation for said effective capacitance from application of an equilibrium equation, $$Ceff(si,\pi,w) = F(\pi, Ceff, S(si, w, Ceff), T(si, w, Ceff)) \quad (3)$$

where $S(si,w,Ceff)$ is output slew, and $T(si,w,Ceff)$ is time constant, si is input slew and w represents variational cell process parameters, said equilibrium equation containing in parametric form manufacturing process variations, said manufacturing process variations in said equilibrium equation (represented by the variable "w") from three variation sources: the transition time of the input waveform, the intrinsic cell variations and the variations of compact load from sub-step 1, and wherein, using iterative methods, the nominal solution of said equilibrium equation is calculated and said nominal solution is defined as the operating point of said equilibrium equation where the derivative of said three variation sources is equal to zero, such that taking the derivative of said equilibrium equation with respect to said three variation sources and setting the resulting derivative equations to zero, calculates the parametric variation sensitivities of said effective capacitance;

3. calculating, using said compact interconnect load and said effective capacitance of sub-steps 1 and 2, an equivalent driving circuit of said first logic cell,
   wherein said equivalent driving circuit contains a voltage source connected with a resistance, and where
   said voltage source and said resistance are functions of said three variations sources discussed in sub-step 2, (i.e. input transition, intrinsic cell variations and compact load variations) and
   further said voltage source and said resistance are also functions of the statistical effective capacitance calculated in sub-step 2,
   and wherein variations with respect to said voltage source are calculated directly by taking the derivatives of said equivalent driving circuit with respect to said three variation sources discussed in sub-step 2,
   and wherein by further calculating the effective capacitance introduced variations by calculating the derivatives of said equivalent driving circuit with respect to said effective capacitance and
   by mapping said effective capacitance variation with respect to said three variation sources using chain rule, and
   calculating, (after mapping said derivatives of the effective capacitance to the derivatives of said three variation sources), the parametric variation of said equivalent driving circuit by combining the derivatives and the variations of said three variation sources;

b) calculating, said calculating performed by means of said computational device, delay and transition for said driving circuit of step (a), including the substeps of:

4. calculating transfer function to fanout pins, said transfer function including in parametric form manufacturing process variations;
5. calculating, using said transfer function of substep 4, voltage waveforms at fanout pins, said voltage waveforms including in parametric form manufacturing process variations;

6. calculating, using said voltage waveforms at fanout pins from substep 5, delay and transition from said voltage waveforms; and c) repeating steps a) and b) for each logic cell comprising said integrated circuit of interest, and then outputting results, where said results map manufacturing process variations in logic cells comprising said integrated circuit of interest to performance variations of said integrated circuit of interest.

\* \* \* \* \*